(12) United States Patent
Wang (10) Patent No.: US 11,749,174 B2
(45) Date of Patent: Sep. 5, 2023

(54) GATE-ON VOLTAGE GENERATION CIRCUIT, DISPLAY PANEL DRIVING DEVICE AND DISPLAY DEVICE

(71) Applicants: CHONGQING ADVANCE DISPLAY TECHNOLOGY RESEARCH, Chongqing (CN); CHONGQING HKC OPTOELECTRONICS TECHNOLOGY CO., LTD., Chongqing (CN)

(72) Inventor: Mingliang Wang, Chongqing (CN)

(73) Assignees: CHONGQING ADVANCE DISPLAY TECHNOLOGY RESEARCH, Chongqing (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 17/894,382

(22) Filed: Aug. 24, 2022

(65) Prior Publication Data
US 2022/0398971 A1    Dec. 15, 2022

Related U.S. Application Data

(63) Continuation of application No. PCT/CN2021/141718, filed on Dec. 27, 2021.

(30) Foreign Application Priority Data

Feb. 4, 2021   (CN) .......................... 202110157134.4

(51) Int. Cl.
G09G 3/20    (2006.01)
H02M 1/08    (2006.01)
H03K 17/56    (2006.01)

(52) U.S. Cl.
CPC ............. *G09G 3/2096* (2013.01); *H02M 1/08* (2013.01); *H03K 17/56* (2013.01); *G09G 2330/021* (2013.01); *G09G 2330/028* (2013.01)

(58) Field of Classification Search
CPC . H02M 1/08; G09G 3/2096; G09G 2330/026; G09G 2330/021; G09G 2330/028; H03K 17/56; Y02B 70/10
See application file for complete search history.

(56) References Cited

U.S. PATENT DOCUMENTS

| | | | | |
|---|---|---|---|---|
| 6,094,087 A | * | 7/2000 | He | H03K 17/04123 |
| | | | | 327/434 |
| 8,884,597 B2 | * | 11/2014 | Gladish | H03K 17/164 |
| | | | | 323/285 |

(Continued)

FOREIGN PATENT DOCUMENTS

| CN | 101847382 A | 9/2010 |
|---|---|---|
| CN | 101976551 A | 2/2011 |

(Continued)

OTHER PUBLICATIONS

First Office Action issued in counterpart Chinese Patent Application No. 202110157134.4, dated Dec. 7, 2021.

(Continued)

*Primary Examiner* — Vinh T Lam
(74) *Attorney, Agent, or Firm* — Westbridge IP LLC (57) ABSTRACT

Disclosed are a gate-on voltage generation circuit, a display panel driving device and a display device. The gate-on voltage generation circuit includes an on/off voltage output terminal, a power management integrated circuit and a voltage switching circuit. The power management integrated circuit includes a detection terminal connected to the on/off voltage output terminal, is configured for detecting a voltage output by the on/off voltage output terminal, and outputting (Continued)

first switch control signal or second switch control signal according to the voltage output from the on/off voltage output terminal. The voltage switching circuit includes a first input terminal for inputting a first voltage value and a second input terminal for inputting a second voltage value larger than the first voltage value. The voltage switching circuit outputs the first voltage value upon receiving the first switch control signal, and outputs the second voltage value upon receiving the second switch control signal.

16 Claims, 5 Drawing Sheets

(56) References Cited

U.S. PATENT DOCUMENTS

| | | | | |
|---|---|---|---|---|
| 9,093,020 | B2* | 7/2015 | Baek | G09G 3/2096 |
| 9,343,952 | B2* | 5/2016 | Xi | H02M 3/07 |
| 9,806,607 | B2* | 10/2017 | Ranmuthu | H02M 1/08 |
| 9,973,100 | B2* | 5/2018 | Lin | H02M 3/33592 |
| 9,979,292 | B2* | 5/2018 | Zhang | H02M 1/08 |
| 10,411,696 | B2* | 9/2019 | Sugisawa | H02M 3/155 |
| 10,438,530 | B2* | 10/2019 | Yang | G09G 3/36 |
| 10,643,728 | B2* | 5/2020 | Zheng | G11C 19/28 |
| 10,784,860 | B1* | 9/2020 | Sakai | H03K 17/6871 |
| 10,871,810 | B2* | 12/2020 | Kirchner | H02M 3/156 |
| 10,964,242 | B2* | 3/2021 | Wang | G09G 3/20 |
| 11,056,965 | B2* | 7/2021 | Matsubara | H03K 17/165 |
| 11,146,162 | B2* | 10/2021 | Zhang | H02M 1/08 |
| 11,152,933 | B2* | 10/2021 | Matsubara | H02M 7/5395 |
| 11,171,564 | B2* | 11/2021 | Kang | H02M 3/158 |
| 11,201,553 | B2* | 12/2021 | Dou | H02M 3/33592 |
| 11,482,148 | B2* | 10/2022 | Zhu | G09G 3/20 |
| 2004/0036533 | A1* | 2/2004 | Mazda | H03F 1/305 |
| | | | | 330/251 |
| 2006/0007095 | A1* | 1/2006 | Kudo | G09G 3/3614 |
| | | | | 345/98 |
| 2009/0066684 | A1* | 3/2009 | Lee | G09G 3/3648 |
| | | | | 345/211 |
| 2011/0156680 | A1* | 6/2011 | Yeh | H02M 3/156 |
| | | | | 323/282 |
| 2011/0292024 | A1* | 12/2011 | Baek | G09G 3/2096 |
| | | | | 345/212 |
| 2012/0098597 | A1* | 4/2012 | Wei | H03K 17/6877 |
| | | | | 327/434 |
| 2014/0035629 | A1* | 2/2014 | Morita | H03K 17/063 |
| | | | | 327/109 |
| 2014/0062447 | A1* | 3/2014 | Chen | G09G 3/20 |
| | | | | 323/311 |
| 2016/0133179 | A1* | 5/2016 | Choi | G09G 3/2092 |
| | | | | 345/212 |
| 2016/0260374 | A1* | 9/2016 | Inoue | G09G 3/3696 |
| 2016/0335962 | A1 | 11/2016 | Xiao | |
| 2018/0053463 | A1* | 2/2018 | Kong | G09G 3/20 |
| 2018/0096656 | A1* | 4/2018 | Lee | G09G 3/3291 |
| 2018/0159522 | A1* | 6/2018 | Sato | H02M 3/158 |
| 2019/0393873 | A1* | 12/2019 | Watanabe | H05K 1/0262 |
| 2021/0167774 | A1* | 6/2021 | Karasawa | H03K 17/693 |
| 2021/0281174 | A1* | 9/2021 | Kang | H02M 1/32 |
| 2022/0105830 | A1* | 4/2022 | Takahashi | B60L 58/12 |

FOREIGN PATENT DOCUMENTS

| | | |
|---|---|---|
| CN | 101996562 A | 3/2011 |
| CN | 104200790 A | 12/2014 |
| CN | 105976764 A | 9/2016 |
| CN | 107424577 A | 12/2017 |
| CN | 109523969 A | 3/2019 |
| CN | 109658899 A | 4/2019 |
| CN | 209312419 U | 8/2019 |
| CN | 111341240 A | 6/2020 |
| CN | 112951173 A | 6/2021 |
| CN | 112994436 A | 6/2021 |
| KR | 101877019 B1 | 7/2018 |

OTHER PUBLICATIONS

International Search Report and Written Opinion issued in corresponding PCT Applicaiton No. PCT/CN2021/141718, dated Mar. 10, 2022.

Notification to Grant Patent Right for Invention issued in counterpart Chinese Patent Application No. 202110157134.4, dated Apr. 13, 2022.

* cited by examiner

GATE-ON VOLTAGE GENERATION CIRCUIT, DISPLAY PANEL DRIVING DEVICE AND DISPLAY DEVICE

CROSS-REFERENCE TO RELATED APPLICATIONS

This application is a continuation application of International Application No. PCT/CN2021/141718, filed on Dec. 27, 2021, which claims priority to Chinese Patent Application No. 202110157134.4, filed on Feb. 4, 2021. The disclosures of the above-mentioned applications are incorporated herein by reference in their entireties.

TECHNICAL FIELD

The present disclosure relates to the technical field of display driving, and in particular, to a gate-on voltage generation circuit, a display panel driving device and a display device.

BACKGROUND

As the display drive technology develops, large-screen displays have been widely used in household appliances such as large-size TVs and wide-screen computers. With the popularization of large-screen TVs, a higher gate-on voltage $V_{gh}$ is required to ensure the charging effect of thin film transistor (TFT).

The existing display adopts the actual voltage level of the gate-on voltage $V_{gh}$. When the voltage level of the gate-on voltage $V_{gh}$ is insufficient, an input voltage of the gate-on voltage generation circuit is switched to a high-level input voltage to ensure the voltage level of the gate-on voltage $V_{gh}$. However, this switching method is not intelligent enough, and there are problems that the power consumption of the display after switching is too high, and the application is inconvenient.

SUMMARY

The main purpose of the present disclosure is to provide a gate-on voltage generation circuit, a display panel driving device and a display device, which aims to realize that when the gate-on voltage $V_{gh}$ does not require an excessively high voltage level, the input voltage can be switched or maintained to be an input voltage with a lower voltage level.

In order to achieve the above objective, the present disclosure provides a gate-on voltage generation circuit, including: an on/off voltage output terminal, a power management integrated circuit and a voltage switching circuit. The power management integrated circuit includes a detection terminal connected to the on/off voltage output terminal, the power management integrated circuit is configured for detecting a voltage output by the on/off voltage output terminal, and outputting a first switch control signal or a second switch control signal according to the detected voltage output from the on/off voltage output terminal.

The voltage switching circuit includes a controlled terminal connected to the power management integrated circuit; a first input terminal for inputting a first voltage value; and a second input terminal for inputting a second voltage value larger than the first voltage value. The voltage switching circuit is configured to output the first voltage value upon receiving the first switch control signal, and output the second voltage value upon receiving the second switch control signal.

In an embodiment, the gate-on voltage generation circuit further includes a voltage generation circuit. The voltage generation circuit includes an input terminal connected to an output terminal of the voltage switching circuit; and an output terminal connected to the on/off voltage output terminal. The voltage generation circuit is configured to perform power conversion on the first voltage value or the second voltage value, and output the first voltage value or the second voltage value to the on/off voltage output terminal.

In an embodiment, a control terminal of the power management integrated circuit is connected to a controlled terminal of the voltage generation circuit, and the power management integrated circuit is configured for controlling the voltage generation circuit to operate, and to perform power conversion on the first voltage value or the second voltage value and output the first voltage value or the second voltage value to the on/off voltage output terminal.

In an embodiment, the voltage generation circuit includes a first capacitor, a second capacitor, a third capacitor, a first unidirectional conducting element, a second unidirectional conducting element and a switch transistor; an input terminal of the first unidirectional conducting element is an input terminal of the voltage generation circuit, and an output terminal of the first unidirectional conduction element is connected to the power management integrated circuit through the first capacitor; an input terminal of the second unidirectional conducting element is connected to a common terminal of the first unidirectional conducting element and the first capacitor, and an output terminal of the second unidirectional conducting element is grounded through the second capacitor; and a controlled terminal of the switch transistor is connected to the power management integrated circuit, an input terminal of the switch transistor is connected to a common terminal of the second unidirectional conducting element and the second capacitor, an output terminal of the switch transistor is an output terminal of the voltage generation circuit, and the output terminal of the switch transistor is grounded through the third capacitor.

In an embodiment, the switch transistor is any one or a combination of a metal-oxide-semiconductor (MOS) transistor, a triode, and an Insulated Gate Bipolar Transistor (IGBT).

In an embodiment, the first unidirectional conducting element and the second unidirectional conducting element are diodes.

In an embodiment, the voltage switching circuit includes a first switch transistor and a second switch transistor.

An input terminal of the first switch transistor is the first input terminal, a controlled terminal of the first switch transistor is connected to an output terminal of the power management integrated circuit, an output terminal of the first switch transistor is connected to an input terminal of the voltage generation circuit for outputting the first voltage value to the voltage generation circuit when the voltage switching circuit receives the first switch control signal.

An input terminal of the second switch transistor is the second input terminal, a controlled terminal of the second switch transistor is connected to an output terminal of the power management integrated circuit, an output terminal of the second switch transistor is connected to a common terminal of the first switch transistor and the voltage generation circuit for outputting the second voltage value to the voltage generation circuit when the voltage switching circuit receives the second switch control signal.

In an embodiment, the first switch transistor is any one or a combination of a MOS transistor, a triode, and an IGBT;

and/or the second switch transistor is any one or a combination of a MOS transistor, a triode, and an IGBT.

The present disclosure further provides a display panel driving device, including the gate-on voltage generation circuit as described above.

The present disclosure further provides a display device, including the gate-on voltage generation circuit as described above and the display panel driving device as described above.

The present disclosure provides a gate-on voltage generation circuit, including: an on/off voltage output terminal, a power management integrated circuit and a voltage switching circuit. The power management integrated circuit performs real-time detection and judgment on the voltage level of the gate-on voltage $V_{gh}$ of the on/off voltage output terminal through its own integrated hardware circuit and software program or algorithm. The corresponding switch control signal is output to the voltage switching circuit according to the judgment result. When the voltage value corresponding to the voltage detection signal is greater than or equal to the voltage value of the reference voltage, the power management integrated circuit controls the voltage switching circuit to switch or continue to output the first voltage value $HV_{AA}$. When the voltage value corresponding to the voltage detection signal is smaller than the voltage value of the reference voltage, the power management integrated circuit controls the voltage switching circuit to switch and output the second voltage value $V_{AA}$. In the present disclosure, when the voltage level of the on/off voltage output terminal is lower than the voltage level corresponding to the reference voltage, the gate-on voltage generation circuit can switch the input voltage to the second voltage value $V_{AA}$ to ensure the voltage level of the output voltage. When the gate-on voltage $V_{gh}$ does not require an excessively high voltage level, the voltage switching circuit can switch or continue to keep the input voltage at the first voltage value $HV_{AA}$ with a lower voltage level, which is beneficial to reduce the power consumption of the gate-on voltage generation circuit.

BRIEF DESCRIPTION OF THE DRAWINGS

In order to more clearly illustrate the technical solutions in the embodiments of the present disclosure or in the prior art, the following briefly introduces the accompanying drawings that need to be used in the description of the embodiments or the prior art. Obviously, the drawings in the following description are only some embodiments of the present disclosure. For those of ordinary skill in the art, other drawings can also be obtained based on the structures shown in these drawings without any creative effort.

FIG. 4 is a timing diagram of each connection point of the circuit when the embodiment shown in FIG. 2 is in the initial stage of power-on.

The realization of the objective, functional characteristics, and advantages of the present disclosure are further described with reference to the accompanying drawings.

DETAILED DESCRIPTION OF THE EMBODIMENTS

The technical solutions of the embodiments of the present disclosure will be described in more detail below with reference to the accompanying drawings. It is obvious that the embodiments to be described are only some rather than all of the embodiments of the present disclosure. All other embodiments obtained by persons skilled in the art based on the embodiments of the present disclosure without creative efforts shall fall within the scope of the present disclosure.

It should be noted that if there is a directional indication (such as up, down, left, right, front, rear . . . ) in the embodiments of the present disclosure, the directional indication is only used to explain the relative positional relationship, movement, etc. of the components in a certain posture (as shown in the drawings). If the specific posture changes, the directional indication will change accordingly.

In the present disclosure, unless otherwise clearly specified and limited, the terms "connected", "fixed", etc. should be interpreted broadly. For example, "fixed" can be a fixed connection, a detachable connection, or a whole; can be a mechanical connection or an electrical connection; may be directly connected, or indirectly connected through an intermediate medium, and may be the internal communication between two elements or the interaction relationship between two elements, unless specifically defined otherwise. For those of ordinary skill in the art, the specific meaning of the above-mentioned terms in the present disclosure can be understood according to specific circumstances.

In addition, the descriptions associated with, e.g., "first" and "second," in the present disclosure are merely for descriptive purposes, and cannot be understood as indicating or suggesting relative importance or impliedly indicating the number of the indicated technical feature. Therefore, the feature associated with "first" or "second" can expressly or impliedly include at least one such feature. Besides, the technical solutions between the various embodiments can be combined with each other, but they must be based on the realization of those of ordinary skill in the art. When the combination of technical solutions is contradictory or cannot be achieved, it should be considered that such a combination of technical solutions does not exist, nor is it within the scope of the present disclosure.

The present disclosure provides a gate-on voltage generation circuit.

Figure 1:
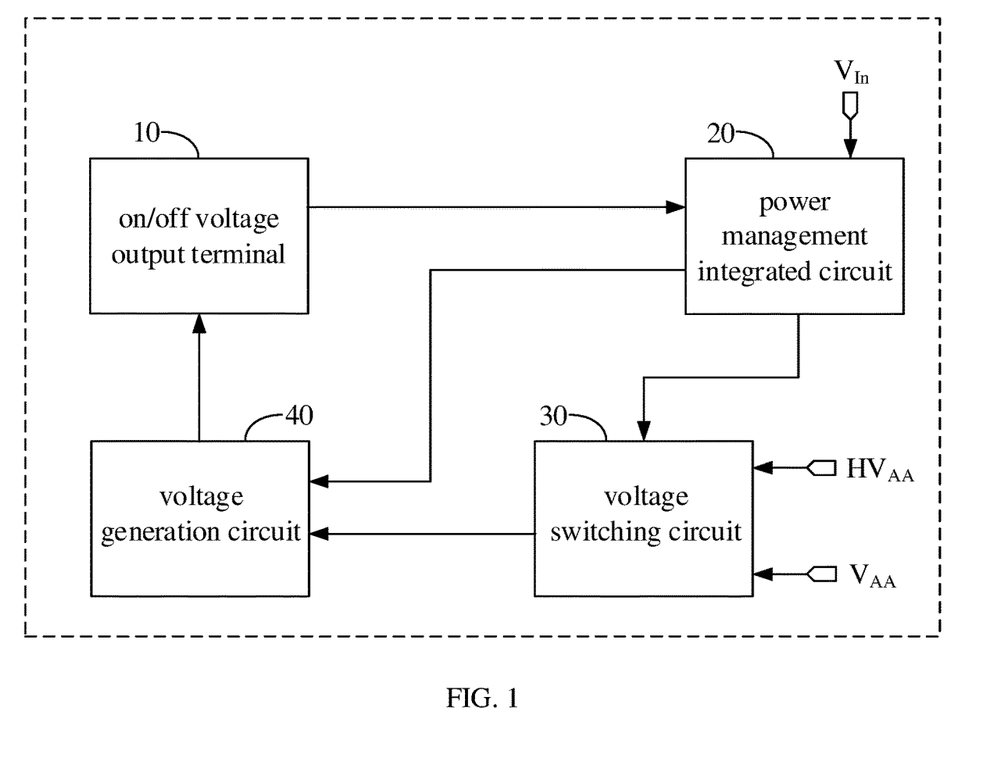
FIG. 1 is a schematic diagram of functional modules of a gate-on voltage generation circuit according to an embodiment of the present disclosure.

As shown in FIG. 1, in an embodiment of the present disclosure, the gate-on voltage generation circuit includes an on/off voltage output terminal 10, a power management integrated circuit 20 and a voltage switching circuit 30.

A detection terminal of the power management integrated circuit 20 is connected to the on/off voltage output terminal 10. The power management integrated circuit 20 is configured for detecting a voltage output by the on/off voltage output terminal 10, and outputting a first switch control signal or a second switch control signal according to the detected voltage output from the on/off voltage output terminal 10.

The voltage switching circuit 30 includes a controlled terminal, a first input terminal and a second input terminal. The controlled terminal of the voltage switching circuit 30 is connected to the power management integrated circuit 20. The first input terminal of the voltage switching circuit 30 inputs a first voltage value $HV_{AA}$, and the second input terminal of the voltage switching circuit 30 inputs a second voltage value $V_{AA}$. The voltage switching circuit 30 is configured to output the first voltage value $HV_{AA}$ upon receiving the first switch control signal, and output the second voltage value $V_{AA}$ upon receiving the second switch control signal. The first voltage value $HV_{AA}$ is smaller than the second voltage value $V_{AA}$.

The gate-on voltage generation circuit further includes a voltage generation circuit 40.

An input terminal of the voltage generation circuit 40 is connected to an output terminal of the voltage switching circuit 30. An output terminal of the voltage generation circuit 40 is connected to the on/off voltage output terminal 10. The voltage generation circuit 40 is configured to perform power conversion on the first voltage value $HV_{AA}$ or the second voltage value $V_{AA}$, and output the first voltage value or the second voltage value to the on/off voltage output terminal 10.

The voltage generation circuit 40 may be a generation circuit 40 of the gate-on voltage $V_{gh}$, or may be a generation circuit 40 of the gate-off voltage $V_{gl}$. The generation circuit 40 of the gate-on voltage $V_{gh}$ is generally a capacitive direct current (DC)/DC booster circuit, and the generation circuit of the gate-off voltage $V_{gl}$ is generally a capacitive DC/DC step-down circuit. The input terminal of the voltage generation circuit 40 is connected to the output terminal of the voltage switching circuit 30. The voltage generation circuit 40 performs corresponding DC/DC conversion according to the first voltage value $HV_{AA}$ or the second voltage value $V_{AA}$ output by the voltage switching circuit 30 and outputs the corresponding gate-on voltage $V_{gh}$ or gate-off voltage $V_{gl}$. This embodiment is described by taking the voltage generation circuit 40 as the generation circuit 40 of the gate-on voltage $V_{gh}$ as an example.

In this embodiment, both the first voltage value $HV_{AA}$ and the second voltage value $V_{AA}$ can be used as the input voltage of the generation circuit 40 of the gate-on voltage $V_{gh}$ (the first voltage value $HV_{AA}$ and the second voltage value $V_{AA}$ can be obtained by the power management chip through corresponding DC/DC conversion, and the second voltage value $V_{AA}$ is greater than the first voltage value $HV_{AA}$). The on/off voltage output terminal 10 is the output terminal of the generation circuit 40 of the gate-on voltage $V_{gh}$. The generation circuit 40 of the gate-on voltage $V_{gh}$ can output the gate-on voltage $V_{gh}$ of the corresponding voltage level according to the input voltage of different voltage levels.

The power management integrated circuit 20 may be implemented by using a power management chip, which may be an alternating current (AC)/DC power management chip, a DC/DC power management chip, or a pulse width modulation (PWM)/pulse frequency modulation (PFM) power management chip. When the application device is a display, the DC/DC power management chip can be selected. A microprocessor and a plurality of DC/DC conversion circuits with different functions are integrated in the power management chip. By running or executing software programs and/or modules stored in the integrated circuit, and calling the data stored in the memory and the self-integrated DC/DC conversion circuit, the power management integrated circuit 20 outputs various voltages to other functional modules in the display. In addition to integrating multiple DC/DC conversion circuits, those skilled in the art can also integrate hardware circuits with other functions in the power management chip to enable the power management chip to implement other functions, such as a voltage detection function and a feedback adjustment function.

In this embodiment, the power management chip integrates hardware circuits such as micro control unit (MCU), analog digital converter (ADC) conversion circuit and filter. The detection end of the power management integrated circuit 20 is implemented by the feedback pin FB. The output terminal of the power management integrated circuit 20 includes a first enable pin EN1 and a second enable pin EN2. The input terminal of the feedback pin FB is connected to the gate-on voltage $V_{gh}$, which is used to output the gate-on voltage $V_{gh}$ in the form of a voltage detection signal to the ADC conversion circuit in the power management chip. The ADC conversion circuit converts the voltage detection signal of the analog signal into a digital signal, and outputs the digital signal to the MCU. The MCU runs or executes the stored software program and/or module and calls the reference voltage stored in the memory, to compare and analyze the voltage detection signal converted into the digital signal to determine whether the output voltage corresponding to the voltage detection signal matches the reference voltage. The MCU outputs a corresponding switch control signal to the voltage switching circuit 30 according to the comparison result between the output voltage corresponding to the voltage detection signal and the reference voltage. The value of the reference voltage is set according to the actual device and is not limited herein. The output terminal of the MCU is connected to the output pin of the power management chip. When the voltage level corresponding to the voltage detection signal is lower than the voltage level of the reference voltage, the MCU outputs the second switch control signal through the second enable pin EN2. When the voltage level corresponding to the voltage detection signal is greater than the voltage level of the reference voltage, the MCU outputs the first switch control signal through the first enable pin EN1. The first switch control signal is a high level signal, and the second switch control signal is a low level signal. Or, the first switch control signal is a low level signal, and the second switch control signal is a high level signal. Or, both the first switch control signal and the second switch control signal are high-level signals or low-level signals. This embodiment is described by taking as an example that both the first switch control signal and the second switch control signal are low-level signals. In some other embodiments, the ADC conversion circuit can also be integrated into the MCU.

The voltage switching circuit 30 can be implemented by any one or a combination of a triode, a MOS transistor, and an IGBT electronic switch. The voltage connected to the first input terminal of the voltage switching circuit 30 is the first voltage value $HV_{AA}$. The voltage connected to the second input terminal is the second voltage value $V_{AA}$. The input voltage of the voltage generation circuit 40 is switched to the first voltage value $HV_{AA}$ or the second voltage value $V_{AA}$ according to the first switch control signal and the second switch control signal output by the power management integrated circuit 20. For example, when the voltage value corresponding to the voltage detection signal is greater than or equal to the voltage value corresponding to the reference voltage, the power management chip determines that the voltage level of the gate-on voltage $V_{gh}$ is too high, the power management chip can output a first switch control signal at a low level to the voltage switching circuit 30, and the voltage switching circuit 30 outputs the first voltage value $HV_{AA}$ to the on/off voltage output terminal 10. When the voltage value corresponding to the voltage detection signal is smaller than the voltage value corresponding to the reference voltage, the power management chip determines that the voltage level of the gate-on voltage $V_{gh}$ is insufficient, the switch control circuit outputs a second switch control signal at a low level to the voltage switch circuit 30, and the voltage switch circuit 30 outputs the second voltage value $V_{AA}$ to the on/off voltage output terminal 10. In other embodiments, a high-level signal may be used to switch the second voltage value $V_{AA}$, and the high-level signal may be used to keep the input voltage to be the first voltage value $HV_{AA}$, which may be set according to practical applications, and is not limited herein.

The present disclosure provides a gate-on voltage generation circuit, including: an on/off voltage output terminal 10, a power management integrated circuit 20 and a voltage switching circuit 30. The power management integrated circuit 20 performs real-time detection and judgment on the voltage level of the gate-on voltage $V_{gh}$ of the on/off voltage output terminal 10 through its own integrated hardware circuit and software program or algorithm. The corresponding switch control signal is output to the voltage switching circuit 30 according to the judgment result. When the voltage value corresponding to the voltage detection signal is greater than or equal to the voltage value of the reference voltage, the power management integrated circuit 20 controls the voltage switching circuit 30 to switch or continue to output the first voltage value $HV_{AA}$. When the voltage value corresponding to the voltage detection signal is smaller than the voltage value of the reference voltage, the power management integrated circuit 20 controls the voltage switching circuit 30 to switch and output the second voltage value $V_{AA}$. In the present disclosure, when the voltage level of the on/off voltage output terminal 10 is lower than the voltage level corresponding to the reference voltage, the gate-on voltage generation circuit can switch the input voltage to the second voltage value $V_{AA}$ to ensure the voltage level of the output voltage. When the gate-on voltage $V_{gh}$ does not require an excessively high voltage level, the voltage switching circuit 30 can switch or continue to keep the input voltage at the first voltage value $HV_{AA}$ with a lower voltage level, which is beneficial to reduce the power consumption of the gate-on voltage generation circuit.

Figure 2:
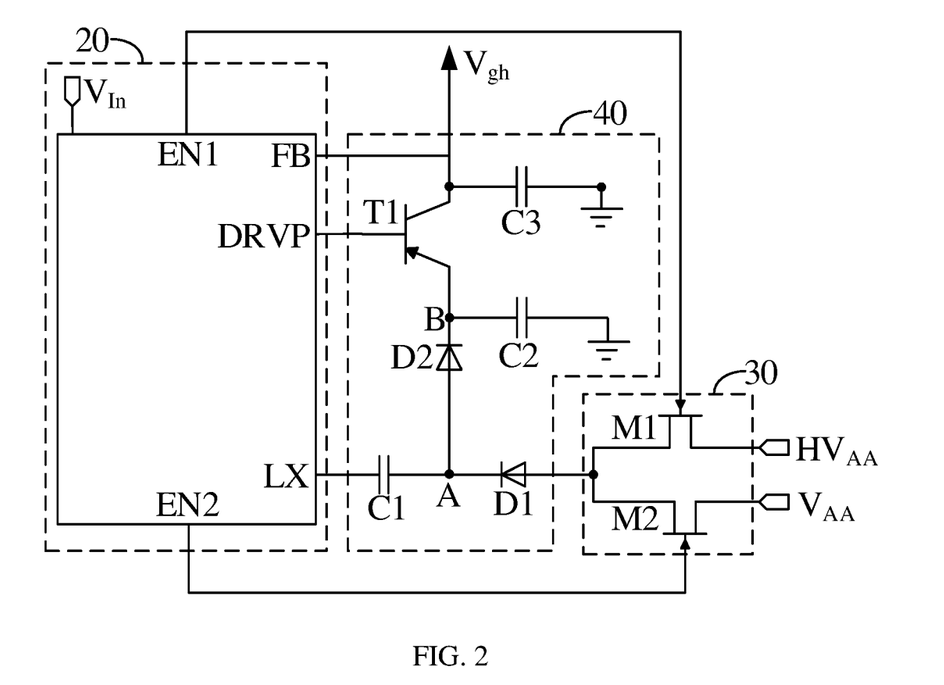
FIG. 2 is a schematic circuit diagram of the gate-on voltage generation circuit according to an embodiment of the present disclosure.

As shown in FIG. 2, in an embodiment of the present disclosure, a control terminal of the power management integrated circuit 20 is connected to a controlled terminal of the voltage generation circuit 40. The power management integrated circuit 20 is configured for controlling the voltage generation circuit 40 to operate, and to perform power conversion on the first voltage value $HV_{AA}$ or the second voltage value $V_{AA}$ and output the first voltage value $HV_{AA}$ or the second voltage value $V_{AA}$ to the on/off voltage output terminal 10.

As shown in FIG. 2, the voltage generation circuit 40 includes a first capacitor C1, a second capacitor C2, a third capacitor C3, a first unidirectional conducting element D1, a second unidirectional conducting element D2 and a switch transistor T1. An input terminal of the first unidirectional conducting element D1 is an input terminal of the voltage generation circuit 40, and an output terminal of the first unidirectional conduction element D1 is connected to the power management integrated circuit 20 through the first capacitor C1. An input terminal of the second unidirectional conducting element D2 is connected to a common terminal of the first unidirectional conducting element D1 and the first capacitor C1, and an output terminal of the second unidirectional conducting element D2 is grounded through the second capacitor C2. A controlled terminal of the switch transistor T1 is connected to the power management integrated circuit 20. An input terminal of the switch transistor T1 is connected to a common terminal of the second unidirectional conducting element D2 and the second capacitor C2. An output terminal of the switch transistor T1 is an output terminal of the voltage generation circuit 40, and the output terminal of the switch transistor T1 is grounded through the third capacitor C3.

The switch transistor T1 is any one or a combination of a MOS transistor, a triode, and an IGBT.

The first unidirectional conducting element D1 and the second unidirectional conducting element D2 are diodes.

When the power management integrated circuit 20 is implemented by the DC/DC power management chip, the power management chip can output different voltage values to other circuit modules through different pins thereof, to control the working states of other circuit modules. For example, the period control signal can be output through the period control pin to control the period of the voltage output by other circuit modules, and the reference voltage can be output through the reference voltage output pin to control the result of voltage comparison in other circuit modules.

Figure 3:
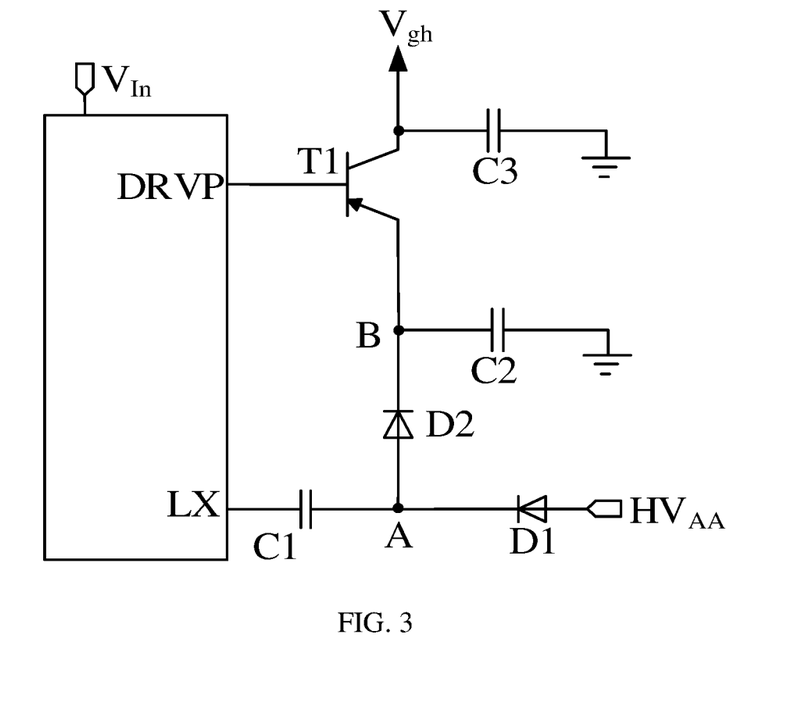
FIG. 3 is a schematic circuit diagram of a voltage generation circuit in FIG. 1.
Figure 5:
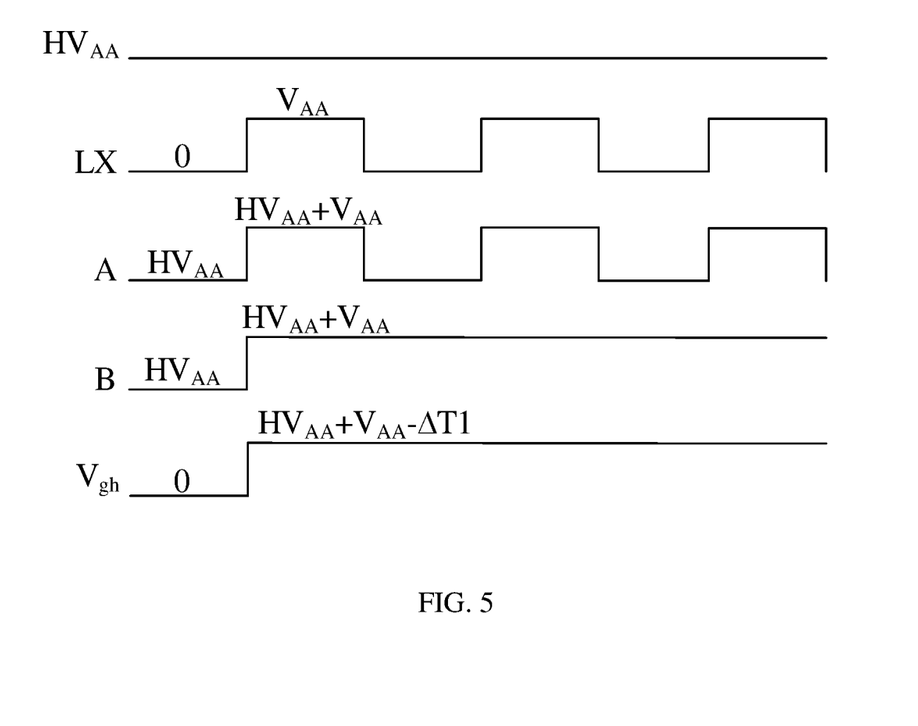
FIG. 5 is a timing diagram of each connection point of the circuit in the embodiment shown in FIG. 3.

Further, in an embodiment, the control terminal of the power management chip controls the voltage generation circuit 40 to generate the gate-on voltage $V_{gh}$ of the corresponding voltage level by outputting the period control signal and the turn-on control signal to the generation circuit 40 of the gate-on voltage $V_{gh}$. As shown in FIG. 3, the generation circuit 40 of the gate-on voltage $V_{gh}$ can be realized by using diodes (D1, D2), capacitors (C1 to C3) and transistor T1. The capacitor C1 is connected to the timing control pin LX of the power management chip for receiving the period control signal output by the power management chip. The control pole of the transistor T1 is connected to the output pin DRVP of the power management chip. The transistor T1 is used to output the gate-on voltage $V_{gh}$ to the on/off voltage output terminal 10 when receiving the turn-on control signal output by the power management chip. The capacitor C2 and the capacitor C3 are energy storage capacitors, the first voltage value $HV_{AA}$ is the input voltage of the gate-on voltage $V_{gh}$, and the period control signal output by the control pin LX switches between 0V and the second voltage value $V_{AA}$. When the period control signal is 0V, the first voltage value $HV_{AA}$ charges the capacitor C1 through the diode D1, and charges the capacitor C2 through the diode D2. At this time, the voltage levels of the A/B points are the first voltage value $HV_{AA}$ (the conduction voltage of the diodes D1 and D2 is ignored at this time). As shown in FIG. 5, when the period control signal is the second voltage value $V_{AA}$, the voltage level at point A is higher than the first voltage value $HV_{AA}$. Due to the capacitive coupling effect of the diode D1 and the capacitor C1, the voltage level at point A is the first voltage value $HV_{AA}$ plus the second voltage value $V_{AA}$. The diode D2 is turned on, and the capacitor C1 charges the capacitor C2, the voltage level at point B is also the first voltage value $HV_{AA}$ plus the second voltage value $V_{AA}$. When the period control signal is 0V again, the voltage level at point B is higher than the voltage level at point A. Due to the capacitive coupling effect of the diode D2 and the capacitor C2, the voltage level at the point B remains the first voltage value $HV_{AA}$ plus the second voltage value $V_{AA}$. The power management chip controls the output pin DRVP to output a turn-on control signal, so that the transistor T1 is turned on, and the capacitor C2 charges the capacitor C3 through transistor T1. The voltage level of the gate-on voltage Vgh output by the circuit is the first voltage value $HV_{AA}$ plus the second voltage value $V_{AA}$-$\Delta T1$ ($\Delta T1$ is the voltage difference between the two ends of T1). The power management integrated circuit 20 outputs relevant control signals to the voltage generation circuit 40 to control the voltage generation circuit 40 to generate an output voltage of a corresponding voltage level according to the received input voltage, so as to adjust the voltage level of the output voltage.

As shown in FIG. 2, in an embodiment of the present disclosure, the voltage switching circuit 30 includes a first switch transistor M1 and a second switch transistor M2.

An input terminal of the first switch transistor M1 is the first input terminal, a controlled terminal of the first switch transistor M1 is connected to an output terminal of the power management integrated circuit 20, and an output terminal of the first switch transistor M1 is connected to an input terminal of the voltage generation circuit 40 for outputting the first voltage value $HV_{AA}$ to the voltage generation circuit 40 when the voltage switching circuit receives the first switch control signal.

An input terminal of the second switch transistor M2 is the second input terminal, a controlled terminal of the second switch transistor M2 is connected to an output terminal of the power management integrated circuit 20, and an output terminal of the second switch transistor M2 is connected to a common terminal of the first switch transistor M1 and the voltage generation circuit 40 for outputting the second voltage value $V_{AA}$ to the voltage generation circuit 40 when the voltage switching circuit 30 receives the second switch control signal.

The first switch transistor M1 is any one or a combination of a MOS transistor, a triode, and an IGBT. The second switch transistor M2 is any one or a combination of a MOS transistor, a triode, and an IGBT.

In this embodiment, the first switch transistor M1 and the second switch transistor M2 can be implemented by any one or a combination of a triode, a MOS transistor, and an IGBT electronic switch. In an embodiment, the first switch M1 and the second switch M2 are implemented by a single P-MOS transistor respectively, and are turned on at a low level. The gate, the source and the drain of the P-MOS transistor are the controlled terminal, the input terminal and the output terminal of the first switch transistor M1 in sequence. The gate of the first switch transistor M1 is connected to the first enable pin EN1. The gate of the P-MOS transistor M2 is the controlled terminal of the second switch transistor M2, the source of the P-MOS transistor M2 is the input terminal of the second switch transistor M2, and the drain of the P-MOS transistor M2 is the output terminal of the second switch transistor M2. The gate of the second switch transistor M2 is connected to the second enable pin EN2.

Figure 4:
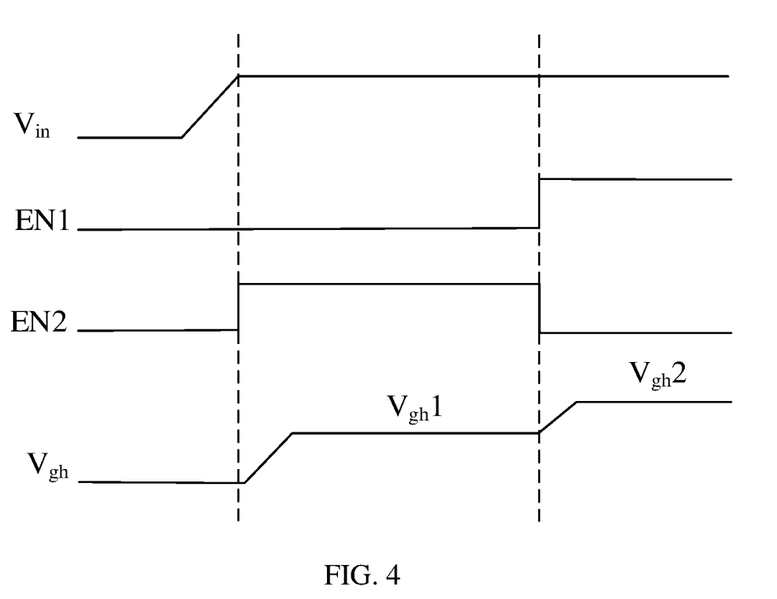

As shown in FIG. 4, when the voltage level of the gate-on voltage $V_{gh}$ is greater than or equal to the voltage level of the reference voltage, the voltage value corresponding to the voltage detection signal is greater than or equal to the voltage value corresponding to the reference voltage, the power management chip outputs a first switch control signal at a low level through the first enable pin EN1, and the first switch M1 is turned on to switch or continue to maintain the input voltage of the voltage generation circuit 40 as the first voltage value $HV_{AA}$. At this time, the second enable pin EN2 outputs a high-level signal, and the second switch M2 is turned off. When the voltage level of the gate-on voltage $V_{gh}$ is smaller than the voltage level corresponding to the reference voltage, the voltage value corresponding to the voltage detection signal is smaller than the voltage value corresponding to the reference voltage, the power management chip outputs a second switch control signal at a low level through the second enable pin EN2, the second switch M2 is turned on to switch the input voltage of the voltage generation circuit 40 to the second voltage value $V_{AA}$. At this time, the first enable pin EN1 outputs a high level signal, and the first switch M1 is turned off. In this way, the intelligent switching of the input voltage is realized, and when the output voltage does not require an excessively high voltage level, the input voltage can be switched or maintained to be the first voltage value $HV_{AA}$ with a lower voltage level, which is beneficial to reduce the power consumption of the gate-on voltage generation circuit.

The present disclosure further provides a display panel driving device, including the above-mentioned gate-on voltage generation circuit. For the detailed structure of the gate-on voltage generation circuit, reference may be made to the above-mentioned embodiments, and details are not repeated here. It can be understood that, since the above-mentioned gate-on voltage generation circuit is used in the display panel driving device, the embodiments of the display panel driving device include all the technical solutions of all the above-mentioned embodiments of the gate-on voltage generation circuit, and the technical effects achieved are also the same, which will not be repeated herein.

The present application also provides a display device, which includes the above-mentioned gate-on voltage generation circuit, or the above-mentioned display panel driving device.

The display includes the above-mentioned gate-on voltage generation circuit. For the detailed structure of the gate-on voltage generation circuit, reference may be made to the above-mentioned embodiments, and details are not repeated here. It can be understood that, since the above-mentioned gate-on voltage generation circuit is used in the display device, the embodiments of the display device include all the technical solutions of all the above-mentioned embodiments of the gate-on voltage generation circuit, and the technical effects achieved are also the same, which will not be repeated herein. The display device may further include the above-mentioned display panel driving device, which has been described above and will not be repeated herein.

The above are only some embodiments of the present disclosure, and do not limit the scope of the present disclosure thereto. Under the inventive concept of the present disclosure, equivalent structural transformations made according to the description and drawings of the present disclosure, or direct/indirect application in other related technical fields are included in the scope of the present disclosure.

What is claimed is:

1. A gate-on voltage generation circuit, comprising:
   an on/off voltage output terminal;
   a power management integrated circuit comprising a detection terminal connected to the on/off voltage output terminal, wherein the power management integrated circuit is configured for detecting a voltage output by the on/off voltage output terminal, and outputting a first switch control signal or a second switch control signal according to the detected voltage output from the on/off voltage output terminal; and
   a voltage switching circuit comprising:
      a controlled terminal connected to the power management integrated circuit;
      a first input terminal for inputting a first voltage value; and
      a second input terminal for inputting a second voltage value larger than the first voltage value, wherein the voltage switching circuit is configured to output the first voltage value upon receiving the first switch control signal, and output the second voltage value upon receiving the second switch control signal.

2. The gate-on voltage generation circuit of claim 1, further comprising:
a voltage generation circuit comprising:
an input terminal connected to an output terminal of the voltage switching circuit;
an output terminal connected to the on/off voltage output terminal,
wherein the voltage generation circuit is configured to perform power conversion on the first voltage value or the second voltage value, and output the first voltage value or the second voltage value to the on/off voltage output terminal.

3. The gate-on voltage generation circuit of claim 2, wherein a control terminal of the power management integrated circuit is connected to a controlled terminal of the voltage generation circuit, and the power management integrated circuit is configured for controlling the voltage generation circuit to operate, and to perform power conversion on the first voltage value or the second voltage value and output the first voltage value or the second voltage value to the on/off voltage output terminal.

4. The gate-on voltage generation circuit of claim 3, wherein:
the voltage generation circuit comprises a first capacitor, a second capacitor, a third capacitor, a first unidirectional conducting element, a second unidirectional conducting element and a switch transistor;
an input terminal of the first unidirectional conducting element is an input terminal of the voltage generation circuit, and an output terminal of the first unidirectional conduction element is connected to the power management integrated circuit through the first capacitor;
an input terminal of the second unidirectional conducting element is connected to a common terminal of the first unidirectional conducting element and the first capacitor, and an output terminal of the second unidirectional conducting element is grounded through the second capacitor; and
a controlled terminal of the switch transistor is connected to the power management integrated circuit, an input terminal of the switch transistor is connected to a common terminal of the second unidirectional conducting element and the second capacitor, an output terminal of the switch transistor is an output terminal of the voltage generation circuit, and the output terminal of the switch transistor is grounded through the third capacitor.

5. The gate-on voltage generation circuit of claim 4, wherein the switch transistor is any one or a combination of a metal-oxide-semiconductor (MOS) transistor, a triode, and an Insulated Gate Bipolar Transistor (IGBT).

6. The gate-on voltage generation circuit of claim 4, wherein the first unidirectional conducting element and the second unidirectional conducting element are diodes.

7. The gate-on voltage generation circuit of claim 2, wherein the voltage switching circuit comprises:
a first switch transistor, wherein an input terminal of the first switch transistor is the first input terminal, a controlled terminal of the first switch transistor is connected to an output terminal of the power management integrated circuit, an output terminal of the first switch transistor is connected to an input terminal of the voltage generation circuit for outputting the first voltage value to the voltage generation circuit when the voltage switching circuit receives the first switch control signal;
a second switch transistor, wherein an input terminal of the second switch transistor is the second input terminal, a controlled terminal of the second switch transistor is connected to an output terminal of the power management integrated circuit, an output terminal of the second switch transistor is connected to a common terminal of the first switch transistor and the voltage generation circuit for outputting the second voltage value to the voltage generation circuit when the voltage switching circuit receives the second switch control signal.

8. The gate-on voltage generation circuit of claim 7, wherein the first switch transistor is any one or a combination of a MOS transistor, a triode, and an IGBT.

9. The gate-on voltage generation circuit of claim 7, wherein the second switch transistor is any one or a combination of a MOS transistor, a triode, and an IGBT.

10. The gate-on voltage generation circuit of claim 1, wherein the power management integrated circuit is a power management chip comprising an alternating current (AC)/direct current (DC) power management chip, a DC/DC power management chip or a pulse width modulation (PWM)/pulse frequency modulation (PFM) power management chip.

11. The gate-on voltage generation circuit of claim 10, wherein when the power management integrated circuit is the DC/DC power management chip, the power management chip outputs different voltage values to other circuit modules through different pins of the power management chip to control working states of other circuit modules.

12. The gate-on voltage generation circuit of claim 10, wherein the power management chip integrates a micro control unit (MCU), an analog digital converter (ADC) conversion circuit and a filter, and an output terminal of the power management integrated circuit comprises a first enable pin and a second enable pin.

13. The gate-on voltage generation circuit of claim 12, wherein in response that a voltage level corresponding to a voltage detection signal is lower than a voltage level of a reference voltage, the MCU is configured to output the second switch control signal through the second enable pin.

14. The gate-on voltage generation circuit of claim 12, wherein in response that a voltage level corresponding to a voltage detection signal is greater than a voltage level of a reference voltage, the MCU is configured to output the first switch control signal through the first enable pin.

15. A display panel driving device, comprising a gate-on voltage generation circuit, the gate-on voltage generation circuit comprising:
an on/off voltage output terminal;
a power management integrated circuit comprising a detection terminal connected to the on/off voltage output terminal, wherein the power management integrated circuit is configured for detecting a voltage output by the on/off voltage output terminal, and outputting a first switch control signal or a second switch control signal according to the detected voltage output from the on/off voltage output terminal; and
a voltage switching circuit comprising:
a controlled terminal connected to the power management integrated circuit;
a first input terminal for inputting a first voltage value; and a second input terminal for inputting a second voltage value larger than the first voltage value, wherein the voltage switching circuit is configured to output the first voltage value upon receiving the first switch control signal, and output the second voltage value upon receiving the second switch control signal.

16. A display device, comprising a display panel driving device comprising a gate-on voltage generation circuit, the gate-on voltage generation circuit comprising:

an on/off voltage output terminal;

a power management integrated circuit comprising a detection terminal connected to the on/off voltage output terminal, wherein the power management integrated circuit is configured for detecting a voltage output by the on/off voltage output terminal, and outputting a first switch control signal or a second switch control signal according to the detected voltage output from the on/off voltage output terminal; and a voltage switching circuit comprising:

a controlled terminal connected to the power management integrated circuit;

a first input terminal for inputting a first voltage value; and a second input terminal for inputting a second voltage value larger than the first voltage value, wherein the voltage switching circuit is configured to output the first voltage value upon receiving the first switch control signal, and output the second voltage value upon receiving the second switch control signal.

\* \* \* \* \*